United States Patent [19]

Critchlow et al.

[11] Patent Number: 5,369,087
[45] Date of Patent: Nov. 29, 1994

[54] METHOD FOR THE RAPID PRODUCTION OF SUPERCONDUCTING CERAMIC WIRES OR RIBBONS

[75] Inventors: Philip R. Critchlow, St Bruno; Julian Cave, Montreal, both of Canada

[73] Assignee: Noranda Inc., Toronto, Canada

[21] Appl. No.: 728,387

[22] Filed: Jul. 11, 1991

[30] Foreign Application Priority Data

Nov. 21, 1990 [CA] Canada .................. 2030483

[51] Int. Cl.$^5$ ............................................. H01L 39/24
[52] U.S. Cl. .................... 505/430; 505/451; 505/725; 505/742
[58] Field of Search ............ 29/599; 505/1, 725, 505/742, 430, 451; 156/620.7

[56] References Cited

U.S. PATENT DOCUMENTS

| | | | |
|---|---|---|---|
| 2,739,088 | 3/1956 | Pfann | 156/620.7 X |
| 4,962,085 | 10/1990 | deBarbadillo, II et al. | 505/1 |
| 5,015,618 | 5/1991 | Levinson | 505/1 |

FOREIGN PATENT DOCUMENTS

| | | |
|---|---|---|
| 0344812 | 12/1989 | European Pat. Off. |
| 979476 | 1/1965 | United Kingdom |
| WO90/08389 | 7/1990 | WIPO |

OTHER PUBLICATIONS

R. L. Meng et al, *Nature*, "Manufacture of Bulk Superconducting $YBa_2Cu_3O_{7-6}$ by a Continuous Process," vol. 345, May 24, 1990, pp. 326–328.

High TC Update, vol. 4, No. 11, Jun. 1, 1990.
McGinn et al, *Physica*, "Texture Processing of Extruded $YBa_2Cu_3O_{6+x}$ Wires by Zone Melting," C-165 (1990), pp. 480–484.
McGinn et al, *Physica*, "Texture Processing of Bulk $Yba_2Cu_3O_{6+x}$ by Zone Melting," C-161 (1989), pp. 198–204.

*Primary Examiner*—Joseph M. Gorski
*Attorney, Agent, or Firm*—Foley & Lardner

[57] ABSTRACT

A melt-texturing method for producing high transition temperature superconducting ceramic elements of given length, such as wires of $Y Ba_2Cu_3O_{7-\delta}$, which method is much faster and efficient than the existing ones. In this method, an element made of grains of superconducting ceramic precursor material is subjected to zone melting at a number of different locations equally spaced apart along its length. This multi-zone-melting is carried out at the same time, under the same temperature and speed conditions and in the same direction so as to form a same number of similarly textured zones along the length of the element, which zones grow up while the method progresses until they merge. This method makes it possible to multiply the present rate of production known to be very low, by a number of the same order of magnitude as the number of different locations where zone melting is carried out. If the number of locations is, say, 10, then the rate of production should be multiplied by approximatively the same number, 10.

16 Claims, 3 Drawing Sheets

METHOD FOR THE RAPID PRODUCTION OF SUPERCONDUCTING CERAMIC WIRES OR RIBBONS

BACKGROUND OF THE INVENTION a) Field of the Invention

The present invention relates to an improved method for producing high transition temperature superconducting ceramic elements of given length, which method is much more rapid and efficient than the existing ones.

In the following disclosure, "element of given length" means a wire, a ribbon, a rod, a ring, a cylinder or any similar article of elongated shape, made up of superconducting ceramic material.

Similarly, "high transition temperature a superconducting ceramic" means any superconducting ceramic material such as, for example, $Y\ Ba_2Cu_3O_{7\delta}$ for oxides of Bi, Sr, Ca and Cu, or of Tl, Sr, Ca and Cu, which ceramic material has a high transition temperature Tc greater than the boiling point of liquid nitrogen (77K).

b) Background Of the Invention

High transition temperature superconducting ceramics are heralded as important materials for future high-current-density, low-field applications in electric utility equipment and elsewhere.

To make these ceramics actually useful for practical applications, it is necessary to produce them in the form of wires, ribbons, rods, rings or cylinders.

Such a production has proved up to now to be complex and arduous because of the ceramic nature of these materials which, on the one hand, have a granular structure even after sintering and which, on the other hand, always contain some secondary phases, unwanted impurities or pores, which altogether contribute to limit their high critical current densities.

Recently, techniques have been developed to tentatively overcome these problems. One of these techniques, which has proved so far to be the most efficient, consists in melting and texturing a wire, ribbon or rod of superconducting ceramic precursor material in a fashion which resembles the zone melting technique used in the field of metallurgy for the purification of metal, in order to achieve (1) ordered ceramic grain growth by directional solidification and (2) high purity over most of the length of the ceramic element due to the "natural" property of the impurities to accumulate in the liquid phase (or liquidus) of the melt and thus to concentrate in this melt as it "moves" along the wire, ribbon or rod.

This "melt-texturing" technique and its application to the production of wires of superconducting ceramic material a few centimeters long, is disclosed, by way of sample, by R. L. Meng et al in Nature, 345, 326 to 328g (1990) and by P. J. McGinn et al in Physic, C-161, 198-203 (1989) and Physic, C-165, 480–484 (1989).

In practice, this technique comprises four basic steps which are as follows:

1—forming a wire, ribbon or rod made up of grains of ceramic precursor material;
2—sintering these grains;
3—subjecting the resulting sinter to zone melting by passing the wire, ribbon or rod through a tube furnace having a narrow hot zone whose temperature is above the peritectic decomposition temperature of the ceramic precursor material; and
4—subjecting the obtained melt-textured ceramic element to oxygen-annealing in a separate furnace to adjust the oxygen content of this element to any predetermined value known to raise its transition temperature.

As aforesaid, this technique has proven to be efficient at least in labs, to produce in a continuous or semi-continuous manner, short wires of superconducting ceramic, in particular $Y\ Ba_2Cu_3O_{7-}$, which are capable of carrying high currents because they have, on the one hand, aligned grains with good intergranular connectivity as a result of the direct solidification achieved by zone melting and, on the other hand, a reduced concentration of impurities over most of their length as a result of the accumulation of these impurities in the melting zone which "moves" along the wire as this wire moves forwards through the tube furnace, and thus moves toward the "rear" end of the wire that can subsequently be cut-off.

In spite of its reported efficiency, the melt-texturing technique has two major limitations which have prevented it from being scaled up so far.

The first one of these major limitations is the slowness of this technique, which calls for processing rates of a few millimeters per hour only to achieve adequate direct solidification. This first limitation has been recognized by R. L. Meng et al who, at the end of their above-mentioned paper, suggest to vary the processing parameters and/or the phase diagram of the ceramic through doping to improve the speed of grain growth.

The other major limitation is the accumulation of the impurities which tend to concentrate in the melt as the process advances and thus to increase along the superconductor that is being formed, until the electrical and mechanical properties of this conductor are ultimately destroyed. This second limitation "limits" to a few centimeters the length of the wires that can be produced according to this technique.

OBJECT AND SUMMARY OF THE INVENTION

The object of the present invention is to provide an improved method for producing a high transition temperature superconducting ceramic element of any length, which method is derived from the above mentioned melt-texturing technique but is free of the above limitations, thereby circumventing the drawbacks of the prior art.

The method according to the invention comprises substantially the same basic steps as the melt-texturing technique, except for the second one of these basic steps, i.e. the sintering step, which has proven not to be essential to achieve good results and thus can be omitted.

Thus, the method according to the invention comprises the basic steps of:

—forming an element of given length with grains of a high temperature superconducting ceramic precursor material extending adjacent each other over all of this length;

—subjecting this element to zone melting over all of its length at a temperature and a speed sufficient to cause the precursor material to be textured into new grains that are aligned and have a good intergranular connectivity; and —subjecting the so-obtained, melt-textured superconducting ceramic element to oxygen annealing in order to adjust its oxygen level and raise its transition temperature.

The method according to the invention, however, further distinguishes over the existing technique in that the element is subjected to the above mentioned zone melting at a number of different locations equally spaced apart over at least one part of its length, the zone melting being carried out at this number of different locations at the same time, under the same temperature and speed conditions and in the same direction so as to form a same number of similarly textured zones along the corresponding part of the length of the element, which grow up while the method progresses until all of the textured zones merge. Of course, any other part of the length of the element is then subjected to the same kind of zone melting carried out in the very same manner until all of the length of the element is formed of merging textured zones.

Moreover, prior to subjecting the element to the above mentioned, eventually repeated zone melting at different locations, the spacing between these different locations is adjusted as a function of the amount of impurities initially present in the precursor material to ensure that the concentration of impurities, which tends to increase along the textured zones while the zones are being formed along the element, always remains below a predetermined value where the desired superconductivity of the produced element is not dramatically reduced.

As can now be easily understood, the method according to the invention makes it possible to multiply the present rate of production, known to be very low, by a number of the same order of magnitude as the number of different locations where zone melting is carried out. If the number of locations is, say, 10, then the rate of production should be multiplied by approximatively the same number, 10.

As can also be understood, proper predetermination of the amount of impurities in the starting material will allow proper determination of the spacing between the different zone-melting locations, keeping in mind that two opposite requirements as to the length of such a spacing have to be balanced. Indeed, on the one hand, it is compulsory that the spacing be small enough to prevent too many impurities from accumulating at the "ends" of the textured zones being formed. However, on the other hand, the larger the spacing, the better is the resulting product, since a small overlap between adjacent textured zones is mandatory, although such overlap may affect the conductor's properties and thus is to be avoided as much as possible.

The invention and its advantages will be better understood upon reading the following, more general description thereof, made with reference to the accompanying drawings.

GENERAL DESCRIPTION OF THE INVENTION

The method according to the invention comprises three basic steps, two of which, namely the first and third ones, are rather conventional.

The first step of the method according to the invention consists in forming an element of given length, made up of grains of a high temperature superconducting ceramic precursor material known per se "positioned" so as to extend adjacent each other over all of the length of the element.

In practice, such a forming can be carried out by stacking the grains of precursor material into a hollow tube made of a metal such as Ag, or a metal alloy such as Ag Pd, which is permeable to oxygen in order to allow oxygen annealing of the ceramic material after treatment, and subsequently drawing this tube into a wire or ribbon.

Alternatively, the element may be formed by applying the grains of precursor material onto a support by plasma spraying or doctor blading.

Although this has been found not to be compulsory, the element that has just been formed as disclosed hereinabove may be subjected to a sintering treatment known per se to cause sintering of the grains of precursor material prior to subjecting the element to zone melting. Such a supplemental treatment may speed up the following steps.

The second step of the method according to the invention consists in subjecting the formed and optionally sintered element to zone melting over all of its length at a temperature and a speed sufficient to cause the precursor material to be textured into new grains that are aligned and have a good intergranular connectivity.

In accordance with the invention, such a zone-melting is carried out at a number of different locations shown with arrows in FIGS. 1a to 1c, 2 and 3, which are equally spaced apart over at least one part of the given length.

Figure 1A:
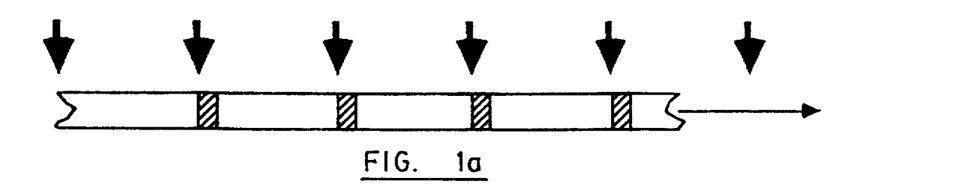
FIG. 1a is a schematic representation of a wire of superconducting precursor material subjected to a multi-zone-melting treatment according to the invention, just after the treatment has started.
Figure 1B:
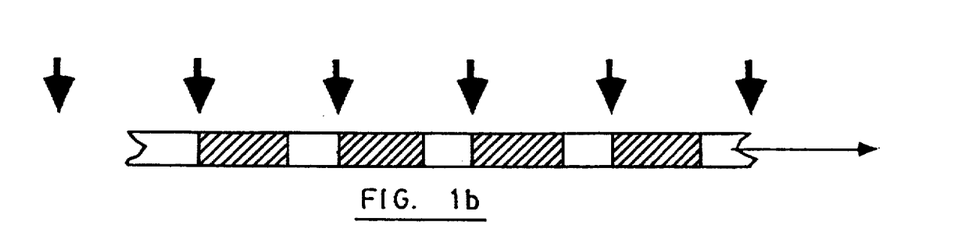
FIGS. 1b and 1c are schematic representations similar to that of FIG. 1a, showing the same wire while the treatment progresses and at the end of it, respectively.
Figure 1C:
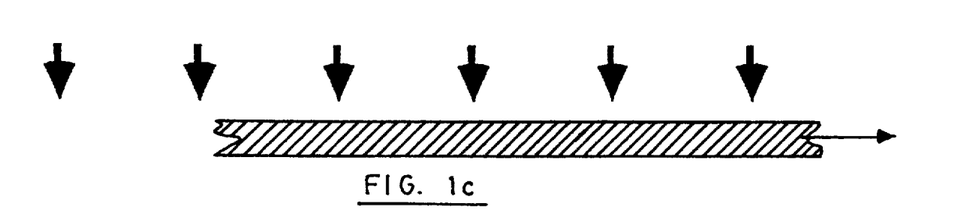

More particularly, zone melting is carried out at this number of different locations at the same time, under the same temperature and speed conditions and in the same direction so as to form a same number of similarly textured zones shown shaded in FIGS. 1a to 1c, which zones extend along the given length of the element and grow up in length until all of them merge (see FIG. 1c).

To reduce into practice such a "multi-zone melting" of the element, use can be made of a plurality of heat sources equally spaced apart, which may consists of infra-red lamps, induction coils, lasers, longitudinal and/or transverse current pulses, etc. Each heat source zone-melts a predetermined length of the conductor (see FIG. 1a which shows the element just after the process has begun, with the textured material shown shaded). As the superconducting element slowly moves forward, preferably under computer control, the textured zones become longer (see FIG. 1b) until they eventually merge (see FIG. 1c).

Thus, the standard rate of production is multiplied approximately by the number of heat sources.

In accordance with a very important aspect of the invention, the spacing between the heat sources has to be determined by the amount of impurities present initially in the element and by the tolerance of the finished conducting ceramic element to the impurity build-up. The larger the spacing the better, since a small overlap of textured zones is mandatory.

Figure 1D:
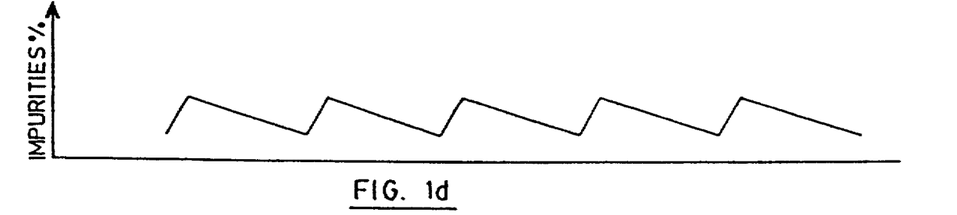
FIG. 1d is a curve showing the percentage of impurities along the wire at the end of the treatment.

However, since the concentration of impurities tends to increase along the textured zones while these zones are being formed along the element (see FIG. 1d) because the impurities "naturally" concentrate into the liquidus of the melt, it is compulsory that this spacing be not so large as to prevent the concentration of impurities from reaching a value where the superconducting properties of the element are "destroyed".

Therefore, these two contradictory requirements must be balanced before starting the treatment, by determining the amount of impurities present in the precursor material, then determining what is the maximum concentration of impurities that may be considered as "acceptable", and finally adjusting the spacing between the heat sources (i.e. the arrows in the Figures) to ensure that the concentration of impurities at the "end" of each textured zone where the melt stops moving is under the maximum value previously determined.

Preferably, the multi-zone-melting treatment may be achieved by moving the element past the number of identical heat sources equally spaced apart as previously called for.

Alternatively, however, the element could remain stationary and the heat sources moved in unison along the same.

The gradient of temperature to be generated by the heat sources into the element to achieve efficient zone melting depends of course on the kind of ceramic material forming this element. This gradient also depends on the heating temperature of the sources and the speed at which the element and sources move with respect to each other.

Assuming for example that the precursor material consists of a fine powder of Y $Ba_2Cu_3O_{7-}$ precursor, each zone melting may be carried out at a temperature ranging from 1000° C. to 1100° C. and at a speed adjusted to have a temperature gradient ranging from 20° to 200° C./mm in the element to make sure that all the impurities be properly dissolved and moved along while the textured zones are being formed.

Other examples of operative conditions with other kinds of ceramics are as follows:

|  | Ytrium-based ceramic | Bismuth-based ceramic | Thallium-based ceramic |
| --- | --- | --- | --- |
| Temp. gradient (°C./mm) | 20–200 | 20–200 | 20–200 |
| Temp. (°C.) | 1000–1000 | 850–900 | 800–1200 |
| Time in hot zone (mins) | 1–15 | 1–15 | 1–15 |
| Sintering temp. (°C.), if any | 925–975 | 800–900 | 800–900 |

The multi-zone-melting treatment can be conducted at ambient or in an inert atmosphere, on the whole element or one part of it only, if this element is long and the number of heat sources are small.

In the latter case, the element shall of course be moved forward rapidly after completion of the multi-zone melting treatment on its one part, to place another part not treated yet in position under the heat sources prior to resuming the treatment.

Once again, this can be easily controlled by a computer. Thus, as soon as a given section of superconducting element has been textured, the programmed computer would automatically, precisely, and rapidly advance the element to the next untreated section before starting again the texturing procedure.

When all of the "parts" of the element have been subjected to zone melting carried out in the very same manner until all the length of the element is formed of merging textured zones, the element can be subjected to the third and last step of the method according to the invention.

This third step, known per se in this field, consists in subjecting the so-obtained, melt-textured superconducting ceramic element to oxygen annealing in order to adjust its oxygen level and raise its transition temperature. Such an oxygen annealing may be carried out in a separate furnace at a temperature of, for example, 450° C.

Figure 2:
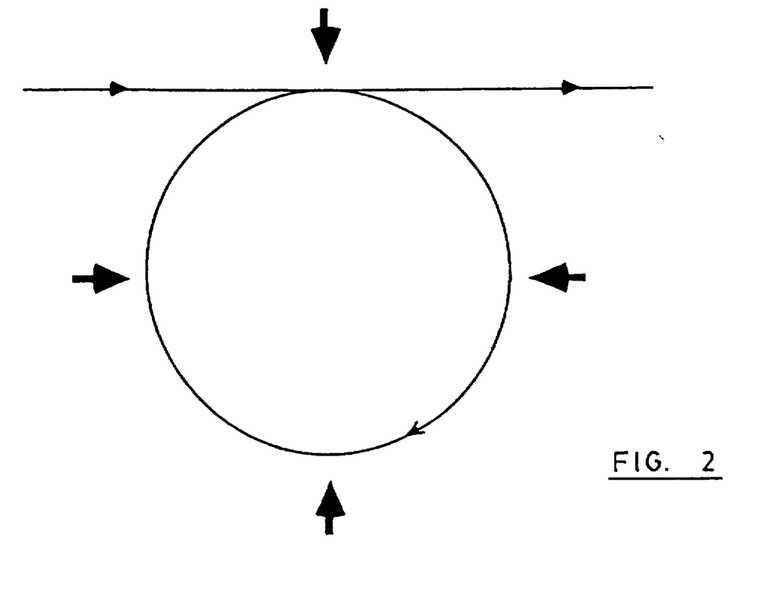
FIG. 2 is a top plan view of a wire moved along a predetermined path, here shown as a spiral, where it is subjected to a multi-zone-melting treatment according to the invention.
Figure 3:
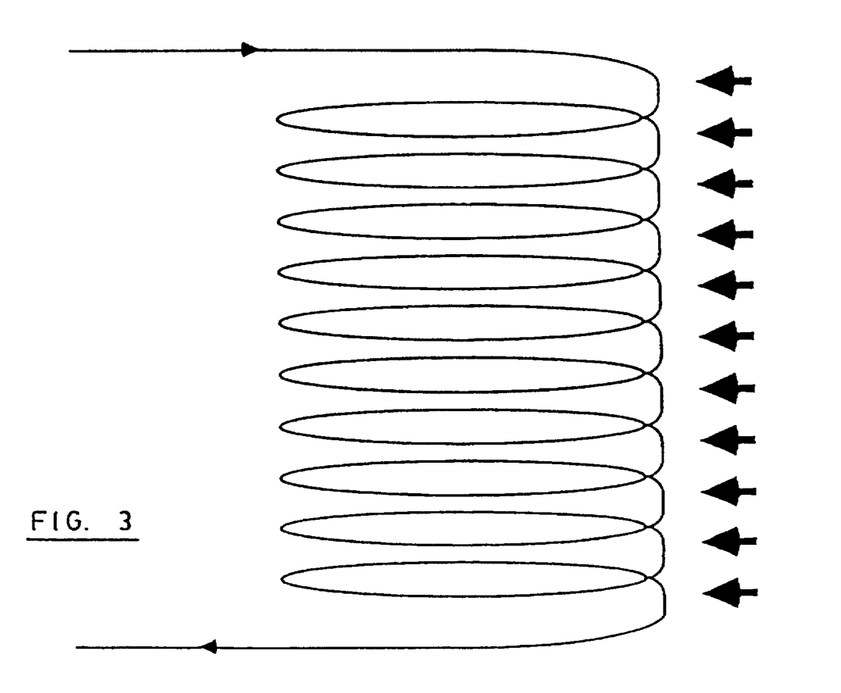
FIG. 3 is a perspective view of the wire shown in FIG. 2 with only one line of heat sources being illustrated.
Figure 4:
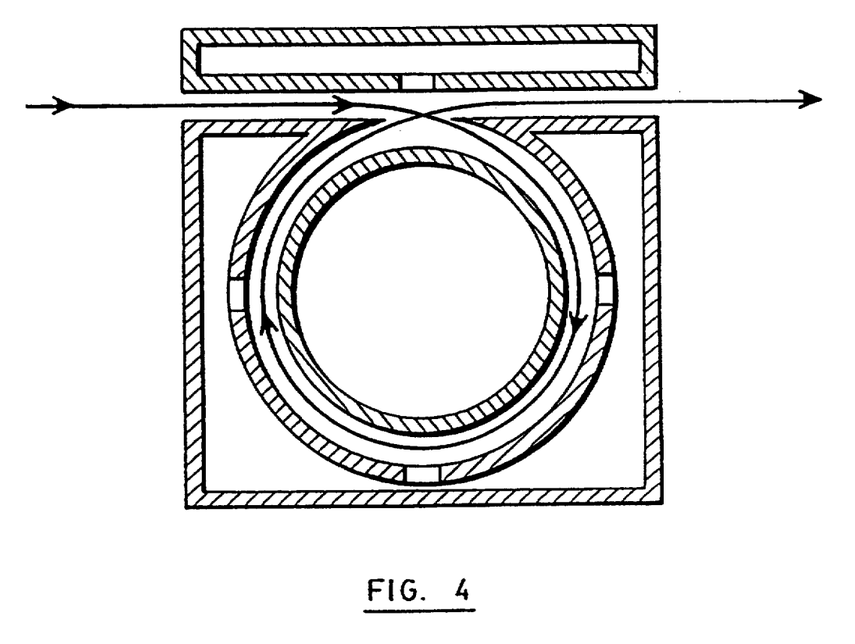
FIG. 4 is a view similar to that of FIG. 2, showing another way of subjecting the same wire moved along a spiral path to a multi-zone-melting treatment according to the invention.

FIGS. 2 to 4 show a practical way of carrying out the second step of the method according to the invention in order to further increase the rate of production.

In this embodiment, the element is moved along a spiral path, thereby forming a multi-layer circular winding, and the heat sources (shown with the arrows) are positioned along at least one but preferably a plurality of lines intersecting this winding.

Instead of using separate heat sources or lines of them, the element may be moved in a spiral-shaped, heat protective shield inserted in a furnace heated at the requested zone melting temperature. In such a case, the heat sources may be defined as holes provided in the shield protecting the element along its spiral path within the furnace, as shown in FIG. 4.

In both cases, the superconducting ceramic element is treated in the form of a multi-layer, circular winding, and lines of heat sources or arrangements of shields could be used to advantage. With a large diameter circle, say 3 m, and a large number of turns, say, 20–200, standard production rates could easily be increased by a factor of $10^3$ to $10^4$ or more.

Of course, temperature control of the environment (conductor, substrate, surrounding atmosphere, etc.) may then be also envisaged.

We claim:

1. A method for producing a high transition temperature superconducting ceramic element of a given length, said method comprising the steps of:

forming an element of given length with grains of a high temperature superconducting ceramic precursor material extending adjacent each other over all of said given length;

subjecting said element to zone melting over all of its length at a temperature and a speed sufficient such that said precursor material becomes textured into new grains that are aligned and have a good intergranular connectivity, thereby forming a melt-textured superconducting ceramic element; and subjecting the melt-textured superconducting ceramic element to oxygen annealing, thereby adjusting its oxygen level and raising its transition temperature, wherein said step of subjecting said element to zone melting includes providing a plurality of heating devices equally spaced apart over at least one part of said given length;

moving said element and said plurality of heating devices relative to each other while each of said heating devices are generating heat of a temperature the same as that of each other said heating device, thereby heating and melting said element, wherein each heating device only heats and melts a portion of said element and each devices, and wherein each of said heating devices moves relative to said element simultaneously with respect to each other said heating device, at a speed equal to that of each other said heating device, and in a direction the same as that of each other said heating device, thereby forming similarly textured zones along said at least one part of said given length of said element until a merging of all of said textured zones occurs, and stopping said zone melting as soon as said textured zones have merged, then subjecting any other part of said given length of said element to the same kind of zone melting carried out in the very same manner until all of said length is formed of merged textured zones, and prior to subjecting said element to said zone melting, adjusting the spacing between said heating devices as a function of the amount of impurities initially present in the precursor material, thereby ensuring that the concentration of impurities which tends to increase along the textured zones while said zones are being formed along said element, always remain under a predetermined value such that superconductivity of the produced element is not dramatically reduced.

2. The method of claim 1, wherein during said moving step said heating devices are stationary while said element is moved relative to said plurality of heating devices.

3. The method of claim 2, wherein during said moving step said element is moved along a spiral path, thereby forming a multi-layer circular winding, and said zone melting step includes positioning said heating devices along at least one line intersecting with said winding.

4. The method of claim 3, wherein said step of moving said element along a spiral path includes moving said element along a spiral path which is completely positioned in a furnace heated at said zone melting temperature, and which is disposed adjacent to said heating devices which are defined as holes in a shield protecting said element from heating along said spiral path.

5. The method of claim 3, wherein said step of forming said element includes applying said grains of precursor material onto a support by one of plasma spraying and doctor blading.

6. The method of claim 2, wherein said step of forming said element includes stacking said grains of precursor material into a hollow tube made of a metal alloy permeable to oxygen and subsequently drawing said tube into a wire or ribbon.

7. The method of claim 6, comprising the additional step of sintering said grains of precursor material of said element prior to subjecting said element to said zone melting.

8. The method of claim 2, wherein said step of forming said element includes applying said grains of precursor material onto a support by one of plasma spraying and doctor blading.

9. The method of claim 8, comprising the additional step of sintering said grains of precursor material of said element prior to subjecting said element to said zone melting.

10. The method of claim 2, comprising the additional step of sintering said grains of precursor material of said element prior to subjecting said element to said zone melting.

11. The method of claim 1, wherein said step of forming said element includes stacking said grains of precursor material into a hollow tube made of a metal alloy permeable to oxygen and subsequently drawing said tube into a wire or ribbon.

12. The method of claim 3, wherein said step of forming said element includes stacking said grains of precursor material into a hollow tube made of a metal alloy permeable to oxygen and subsequently drawing said tube into a wire or ribbon.

13. The method of claim 1, wherein said step of forming said element includes applying said grains of precursor material onto a support by one of plasma spraying and doctor blading.

14. The method of claim 1, comprising the additional step of sintering said grains of precursor material of said element prior to subjecting said element to said zone melting.

15. The method of claim 1, further comprising the step of:

providing said precursor materials, said precursor material consisting of a fine powder of $Y Ba_2 Cu_3 O_{7-\delta}$ precursor; and wherein said step of subjecting said element to zone melting comprises carrying out said zone melting at a temperature ranging from 1000° C. to 1100° C. and at a speed adjusted to have a temperature gradient ranging from 20° to 200° C./mm in the element, thereby ensuring that all the impurities are properly dissolved and moved along while the textured zones are being formed.

16. A method for producing a high transition temperature superconducting ceramic element of a given length, said method comprising the steps of:

forming an element of given length with grains of a high temperature superconducting ceramic precursor material extending adjacent each other over all of said given length;

subjecting said element to zone melting over all of its length at a temperature and a speed sufficient such that said precursor material becomes textured into new grains that are aligned and have a good intergranular connectivity, thereby forming a melt-textured superconducting ceramic element; and subjecting the melt-textured superconducting ceramic element to oxygen annealing, thereby adjusting its oxygen level and raising its transition temperature, wherein said step of subjecting said element to zone melting includes providing a plurality of heating zones which are spaced equally apart;

moving said element and said plurality of heating zones relative to each other while each of said heating zones are generating heat of a temperature the same as that of each other said heating zone, thereby heating and melting said element, wherein each heating zone only heats and melts a portion of said element and each said portion is only heated and melted by one of said heating zones, and wherein each of said heating zones moves relative to said element simultaneously with respect to each other said heating zone, at a speed equal to that of each other said heating zone, and in a direction the same as that of each other said heating zone, thereby forming similarly textured zones which equals the number of individual sections, said zone melting only being performed until a merging of all of said textured zones occurs;

prior to subjecting said element to said zone melting, adjusting the spacing between said heating zones as a function of the amount of impurities initially present in the precursor material, thereby ensuring that the concentration of impurities which tends to increase along the textured zones while said zones are being formed along said element, always remain under a predetermined value such that superconductivity of the produced element is not dramatically reduced.

* * * * *

UNITED STATES PATENT AND TRADEMARK OFFICE
CERTIFICATE OF CORRECTION

PATENT NO. : 5,369,087
DATED : November 29, 1994
INVENTOR(S) : CRITCHLOW et al.

It is certified that error appears in the above-indentified patent and that said Letters Patent is hereby corrected as shown below:

On the title page, item [73] should read --

ATOMIC ENERGY OF CANADA LIMITED/ÉNERGIE ATOMIQUE DU CANADA, Ottowa, Canada
HYDRO-QUEBÉC, Montreal, Canada
ALCATEL CANADA WIRE INC., Don Mills. Canada

--.

Signed and Sealed this

Sixteenth Day of July, 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,369,087
DATED : November 29, 1994
INVENTOR(S) : CRITCHLOW et al.

It is certified that error appears in the above-indentified patent and that said Letters Patent is hereby corrected as shown below:

On title page, item [73], correct Assignees listed as follows:

[73] ATOMIC ENERGY OF CANADA LIMITED/ÉNERGIE ATOMIQUE DU CANADA LIMITÉE, Ottawa, Canada
HYDRO-QUEBÉC, Montreal, Canada
ALCATEL CANADA WIRE INC., North York, Canada Signed and Sealed this Eighth Day of October, 1996

Attest:

BRUCE LEHMAN

*Attesting Officer*     *Commissioner of Patents and Trademarks*